(12) United States Patent
Kang

(10) Patent No.: US 7,393,784 B2
(45) Date of Patent: Jul. 1, 2008

(54) METHOD OF MANUFACTURING SUSPENSION STRUCTURE AND CHAMBER

(75) Inventor: Yu-Fu Kang, Taipei (TW)

(73) Assignee: Touch Micro-System Technology Inc., Yang-Mei, Taoyuan Hsien (TW)

( * ) Notice: Subject to any disclaimer, the term of this patent is extended or adjusted under 35 U.S.C. 154(b) by 56 days.

(21) Appl. No.: 11/550,780

(22) Filed: Oct. 18, 2006

(65) Prior Publication Data

US 2007/0298581 A1    Dec. 27, 2007

(30) Foreign Application Priority Data

Jun. 22, 2006   (TW) ............................... 95122564 A

(51) Int. Cl.
*H01L 21/44*   (2006.01)
(52) U.S. Cl. .................. 438/680; 438/706; 257/E21.17; 257/E21.226; 257/E21.334; 257/E21.577
(58) Field of Classification Search ................ 438/706, 438/680, 745, 712, 9, 637, 670, 678, 681, 438/687, 688, 689, 311
See application file for complete search history.

(56) References Cited

U.S. PATENT DOCUMENTS

| | | | | | |
|---|---|---|---|---|---|
| 5,071,510 | A | * | 12/1991 | Findler et al. ............... | 156/647 |
| 5,110,373 | A | * | 5/1992 | Mauger ..................... | 148/33.2 |
| 5,354,695 | A | * | 10/1994 | Leedy ........................ | 438/706 |
| 2007/0298613 | A1 | * | 12/2007 | Kang ......................... | 438/689 |

* cited by examiner

*Primary Examiner*—David Nhu
(74) *Attorney, Agent, or Firm*—Winston Hsu

(57) ABSTRACT

A method of manufacturing a suspension structure including providing a substrate, forming a hole and a sacrificial layer filling the hole on the substrate, forming a patterned photoresist layer on the substrate and the sacrificial layer, the patterned photoresist layer exposing a part of the substrate and the sacrificial layer, forming a structure layer on the substrate, the patterned photoresist layer, and the sacrificial layer, performing a lift off process to remove the patterned photoresist layer and the structure layer above the photoresist pattern, and performing a dry etch process to remove the sacrificial layer in order to make the structure layer and the hole become the suspension structure and the chamber.

9 Claims, 14 Drawing Sheets

METHOD OF MANUFACTURING SUSPENSION STRUCTURE AND CHAMBER

BACKGROUND OF THE INVENTION

1. Field of the Invention

The present invention relates to a method of manufacturing a suspension structure and chamber, and more particularly, to a method of manufacturing a suspension structure and chamber using a sacrificial layer, dry etching process, and lift off process.

2. Description of the Prior Art

Micro-electromechanical systems (MEMS) are modern technology, which coordinate electrical circuits and mechanics. MEMS have been applied to fabricate devices with both electrical circuits and mechanical elements, such as pressure sensors, accelerators, and micro-microphones. The suspended structure is applied in many MEMS devices such as a MEMS switch, an inkjet nozzle, and micro-microphones, etc., but the method of manufacturing a suspension structure according to the prior art still has many limitations.

Please refer to FIG. 1 to FIG. 4. FIG. 1 to FIG. 4 shows the method of manufacturing a suspension structure and chamber by using wet etching process according to the prior art. As shown in FIG. 1, a metal deposition process is performed on a semiconductor substrate 12 to form an adhesive layer. Before a copper (Cu) metal layer is deposited as a structure layer, the metal deposition process deposits a titanium (Ti) metal layer 14 as an adhesive layer between the semiconductor substrate 12 and the Cu metal layer 16, and the Ti metal layer 14 is deposited on the semiconductor substrate 12 by using an electron gun evaporation system in the metal deposition process. Next, the Cu metal layer 16 is deposited on the Ti metal layer 14, and there are two methods for performing the metal deposition process of the Cu metal layer 16. The first method is directly using the electron gun evaporation system to deposit the Cu metal layer 16 with thickness of about 1 micrometer. The second method is using the electron gun evaporation system to deposit a seed layer first, and then deposit the Cu metal layer 16 on the seed layer by electroplating process. Next, a passivation layer 18 is deposited to protect the Cu metal layer 16. For example, a metal layer of nickel (Ni), chromium (Cr), Ti, or aurum (Au) is deposited as the passivation layer 18 by using the electron gun evaporation system. Then, a photoresist layer 20 is coated on the passivation layer 18 by using a spin coating machine.

As shown in FIG. 2, a first photoresist pattern 22 is formed by a photolithography process on the photoresist layer 20, and then a portion of the passivation layer 18, the Cu metal layer 16, and the Ti metal layer 14 that are not protected by the first photoresist pattern 22 are removed in sequence by a etching process. Next, the first photoresist pattern 22 is removed, and a second photoresist pattern 24 is formed on the passivation layer 18 and the semiconductor substrate 12, as shown in FIG. 3.

At last, a wet etching process using the KOH etching liquid, for example, is performed to form a chamber 26 on the semiconductor substrate 12 to form the suspension structure 10, and the second photoresist pattern 24 is removed, as shown in FIG. 4.

The method of manufacturing a suspension structure according to the prior art has some disadvantages as follows. First, the KOH etching liquid can etch aluminum (Al), and few materials can serve as an etching mask for the KOH etching liquid, only LPCVD Si3N4 or low stress Si3N4 for example. Therefore, the prior art has to use specific metal that is not able to be etched by the KOH etching liquid, or form extra passivation layers and adhesive layers above and under the structure layer respectively. Second, since the prior art uses the wet etching process to remove the semiconductor substrate to form a chamber in the semiconductor substrate, the suspension structure will be affected by the surface tension of the etching liquid, which results in a broken structure layer or the suspension part sticking to the substrate surface. Third, it is very difficult for the prior art methods to design and manufacture the suspension structure and chamber with various shapes by adjusting the process parameters.

SUMMARY OF THE INVENTION

An object of the present invention is to provide a method of manufacturing a suspension structure and chamber to solve the disadvantages and problems of the prior art, and improve the process yield and reduce the cost.

According to the claims, the present invention provides a method of manufacturing a suspension structure and chamber comprising providing a substrate, forming a first photoresist pattern on the substrate, heating the first photoresist pattern to harden it as a sacrificial layer, forming a second photoresist pattern on the substrate and the sacrificial layer, the second photoresist pattern exposing a part of the substrate and the sacrificial layer, forming a structure layer on the substrate, the second photoresist pattern, and the sacrificial layer, performing a lift off process to remove the second photoresist pattern and the structure layer above the second photoresist pattern, and performing a dry etching process to remove the sacrificial layer in order to make the structure layer on the substrate and the sacrificial layer become the suspension structure and the hole on the substrate become the chamber.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
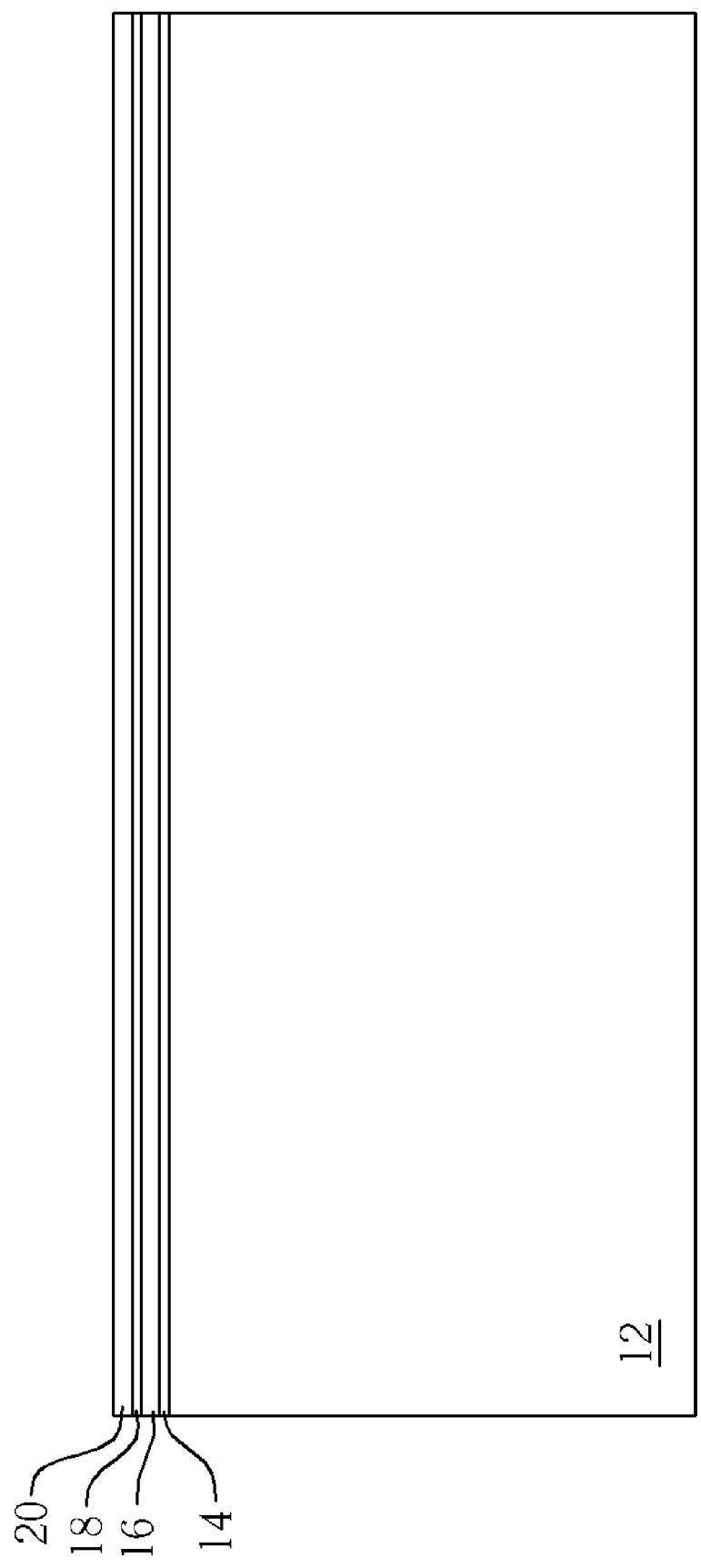
FIG. 1 to FIG. 4 shows the method of manufacturing a suspension structure and chamber by using wet etching process according to the prior art.
Figure 2:
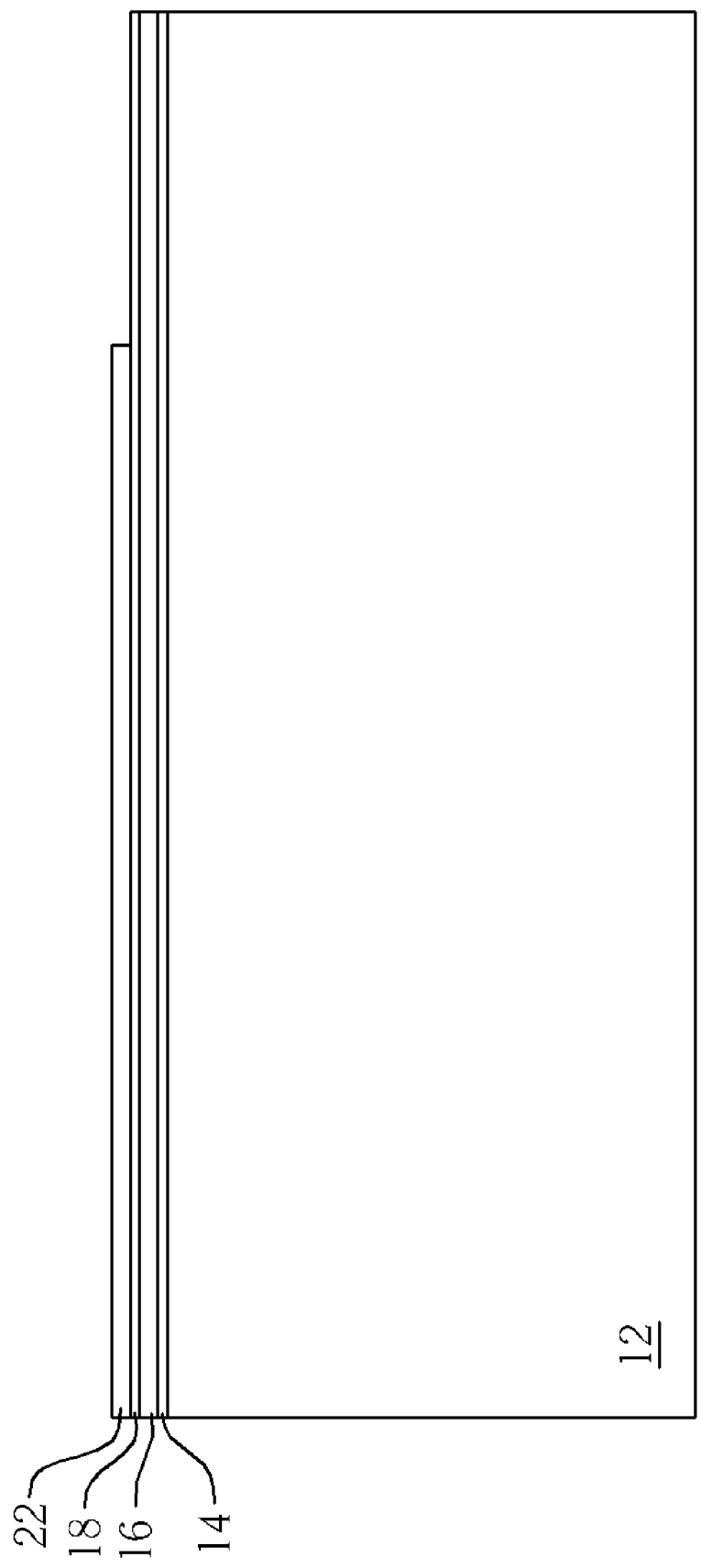
Figure 3:
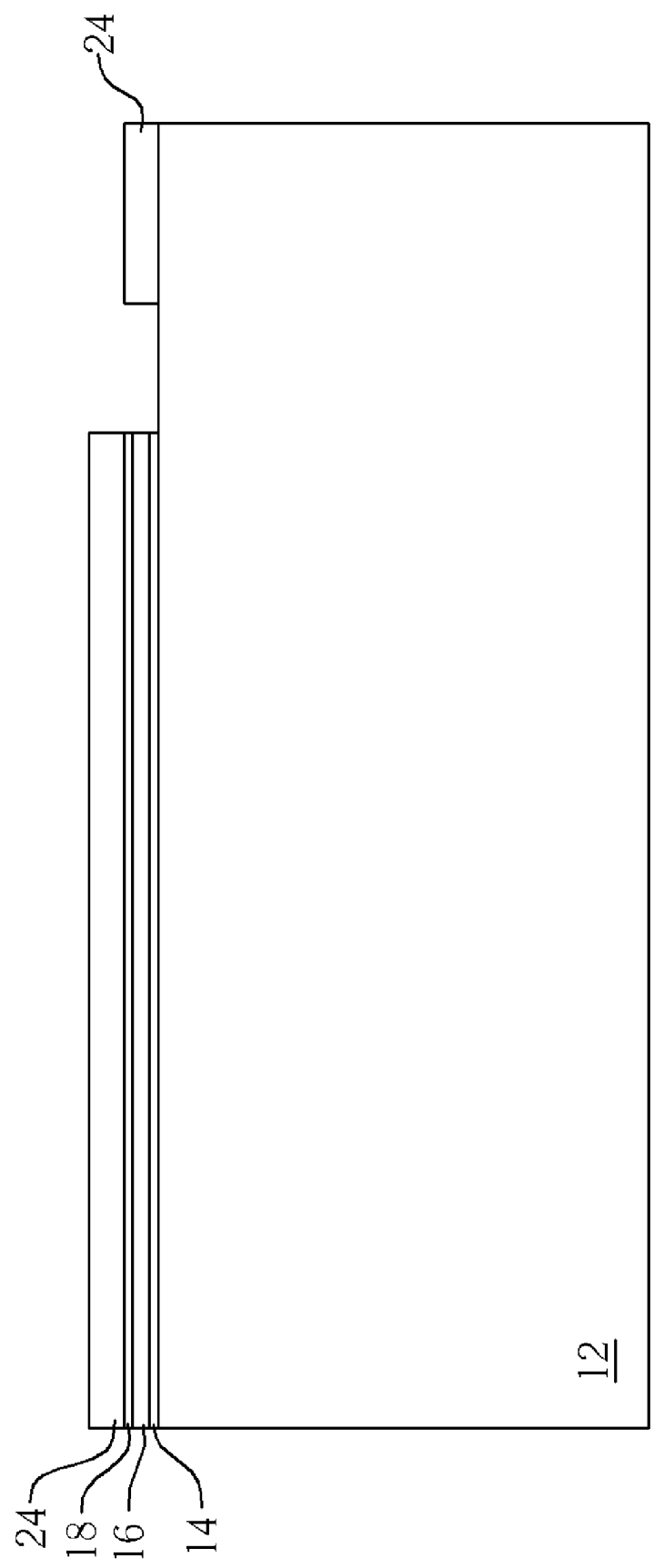
Figure 4:
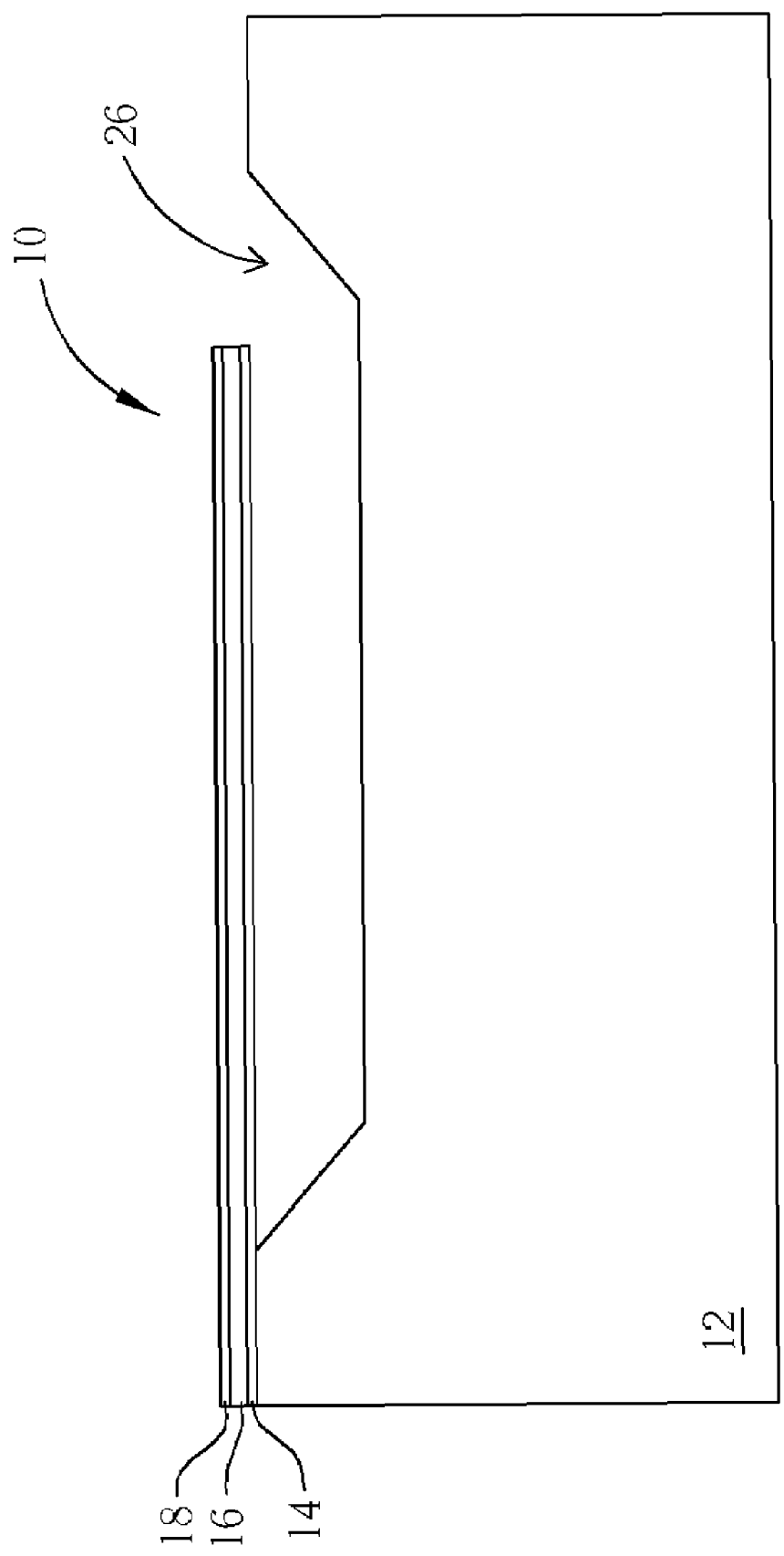
Figure 5:
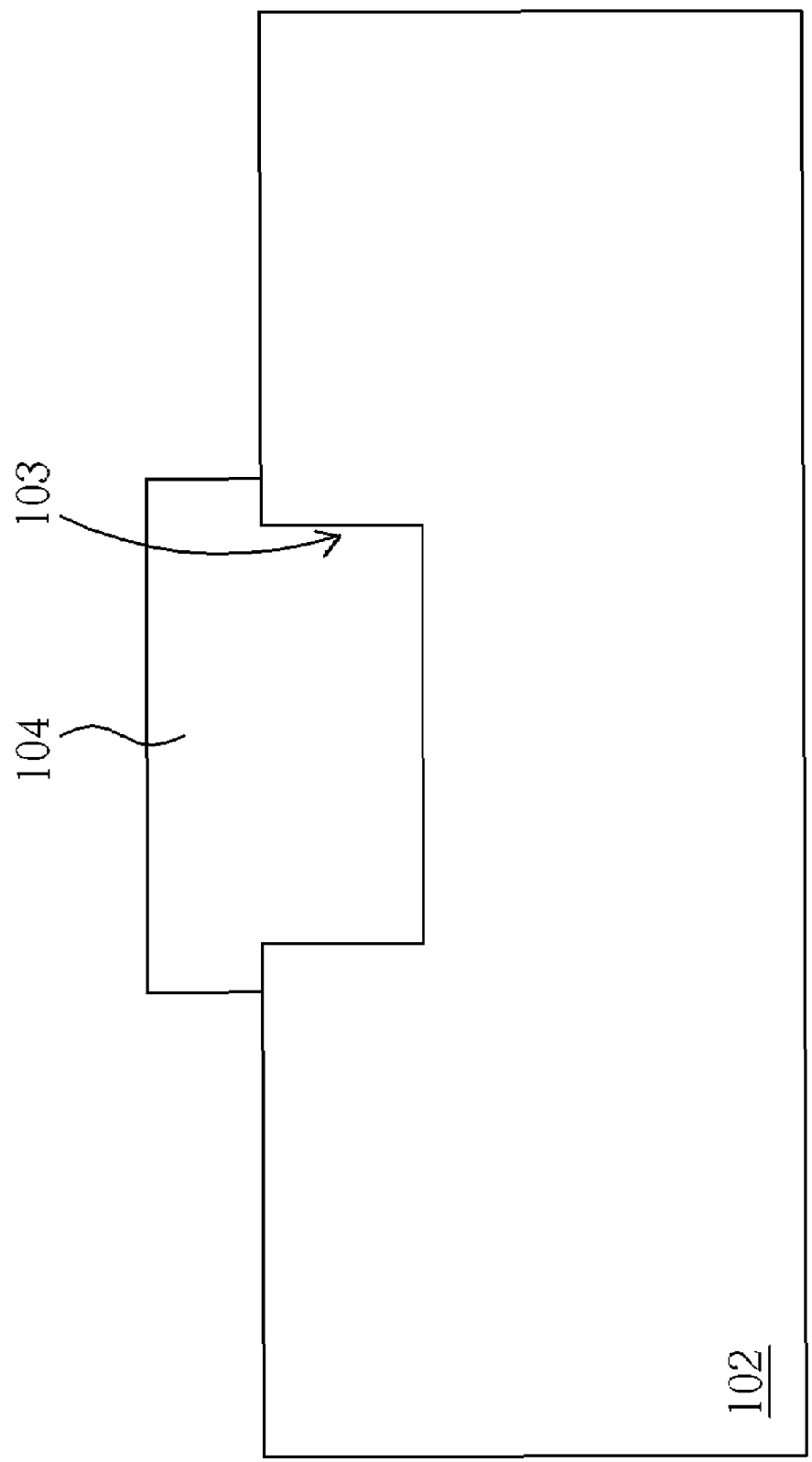
FIG. 5 to FIG. 9 shows the method of manufacturing a suspension structure and chamber in accordance with the first preferred embodiment of the present invention.

Please refer to FIG. 5 to FIG. 9. FIG. 5 to FIG. 9 shows the method of manufacturing a suspension structure and chamber in accordance with the first preferred embodiment of the present invention. As shown in FIG. 5, a hole 103 is formed on the substrate 102 first, and a first patterned photoresist layer 104 is formed on the substrate 102, wherein the substrate 102 can be a silicon wafer or a SOI, but is not limited to this. The method of forming the hole 103 can include a wet etching process, a sputtering etching process, a plasma etching process, or a reactive ion etching (RIE) process, and the shape of the hole 103 can be a semicircle, semi-ellipse, trapezoid, rectangle, trapezoid with round corners, or rectangle with round corners by adjusting the process parameters to meet the requirement of different MEMS devices.

Figure 6:
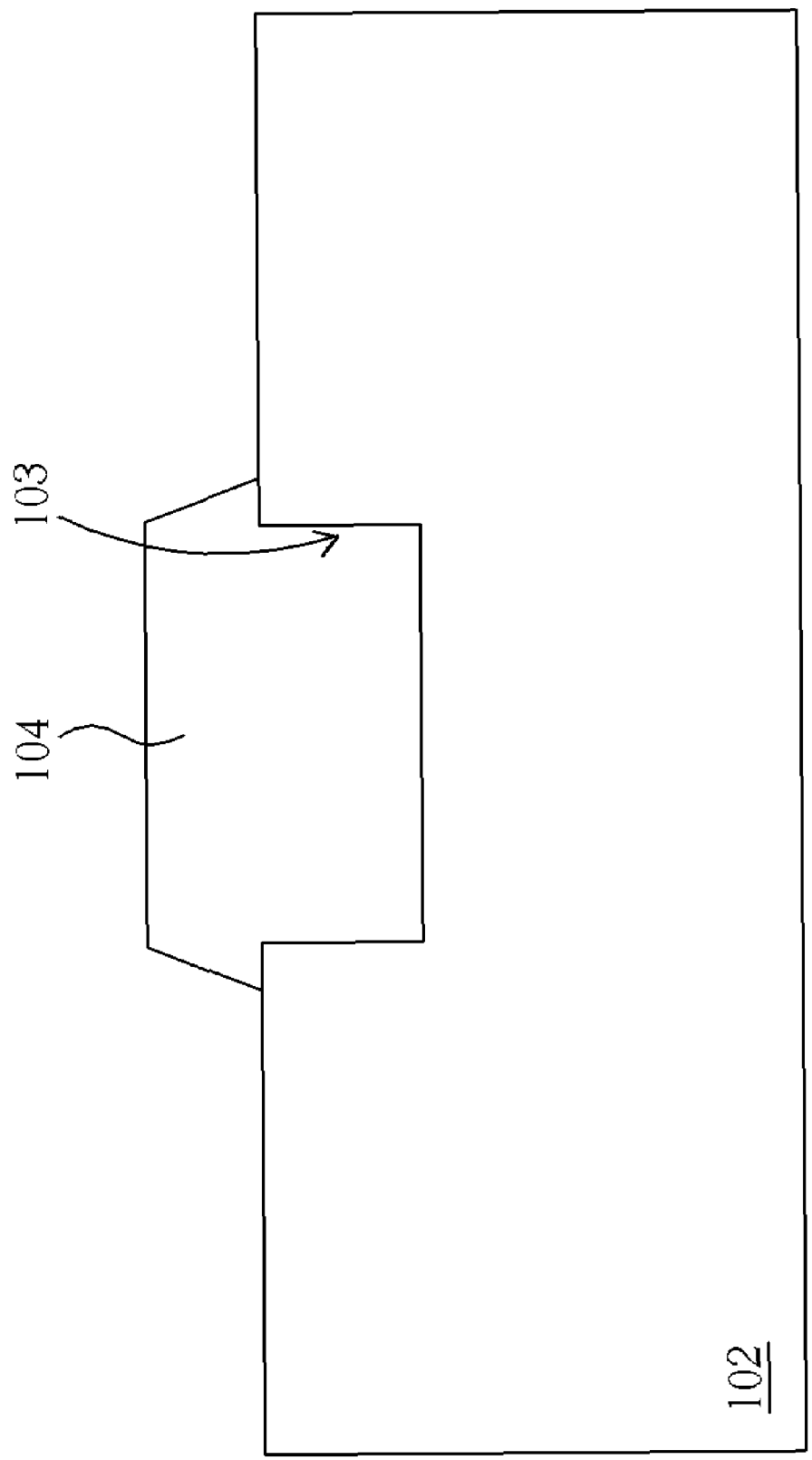

Next, as shown in FIG. 6, since the photoresist will be fluid and then hardened after being heated, the first patterned photoresist layer 104 is heated to be hardened as a sacrificial layer 106. The process of heating the first patterned photoresist layer 104 can be performed using an oven or heating plate, etc. In the first preferred embodiment of the present invention, the sacrificial layer 106 has tilted sidewalls by adjusting the heating process parameters such as the heating temperature and time, as shown in FIG. 6.

Figure 7:
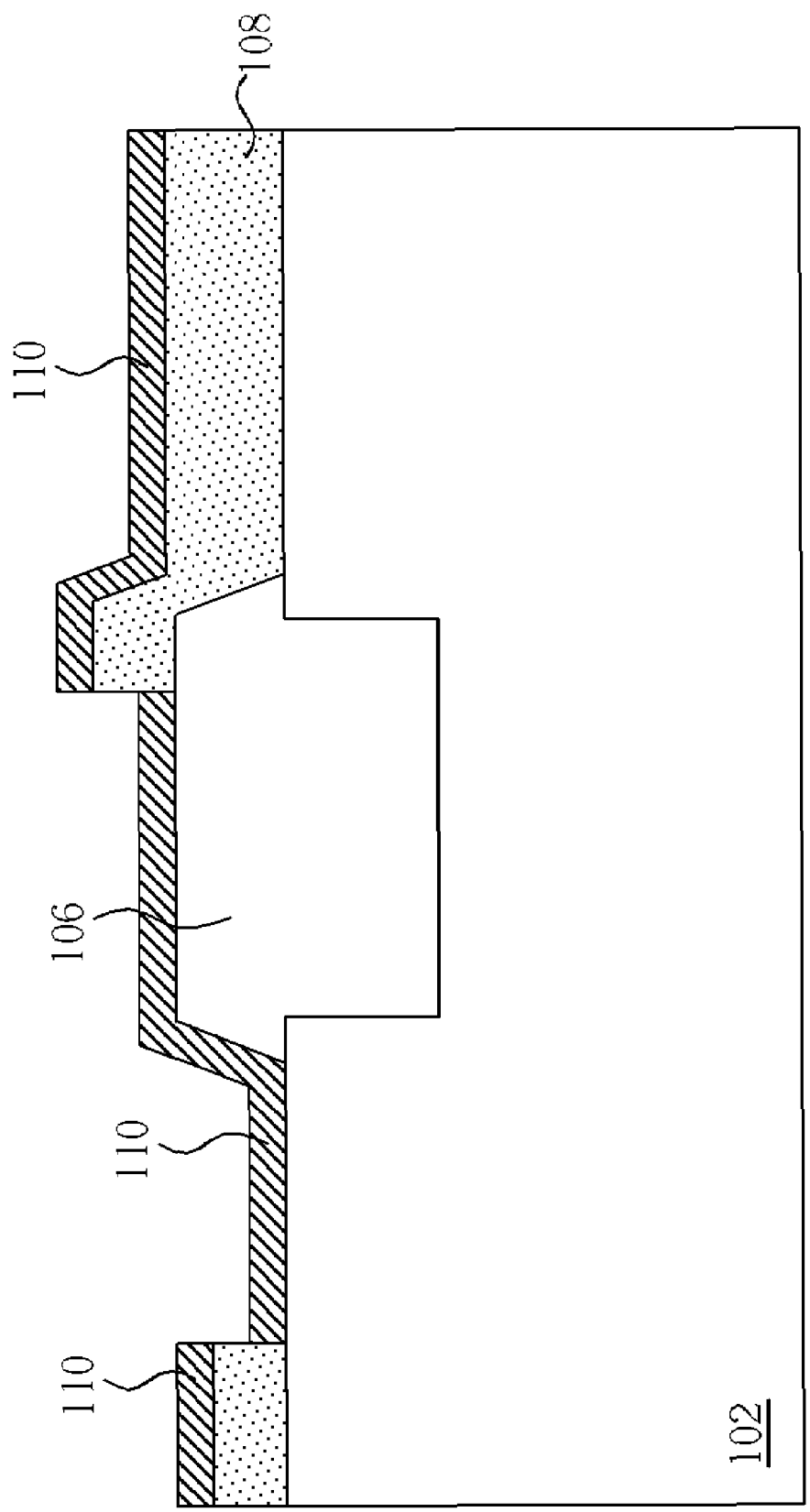

Next, as shown in FIG. 7, a second patterned photoresist layer 108 is formed on the substrate 102 and the sacrificial layer 106, and the second patterned photoresist layer 108 exposes a part of the substrate 102 and the sacrificial layer 106, and then a structure layer 110 is formed on the substrate 102, the second patterned photoresist layer 108, and the sacrificial layer 106. The structure layer 110 can include monocrystalline silicon, polycrystalline silicon, amorphous silicon, or metals such as Al or Cu, etc., and the method of forming the structure layer 110 can include a chemical vapor deposition (CVD) process or a plating process. In addition, if the CVD process is chosen to form the structure layer 110, an atmospheric pressure chemical vapor deposition (APCVD) process can be used in the present invention to make the structure layer 110 smoother on the surface.

Figure 8:
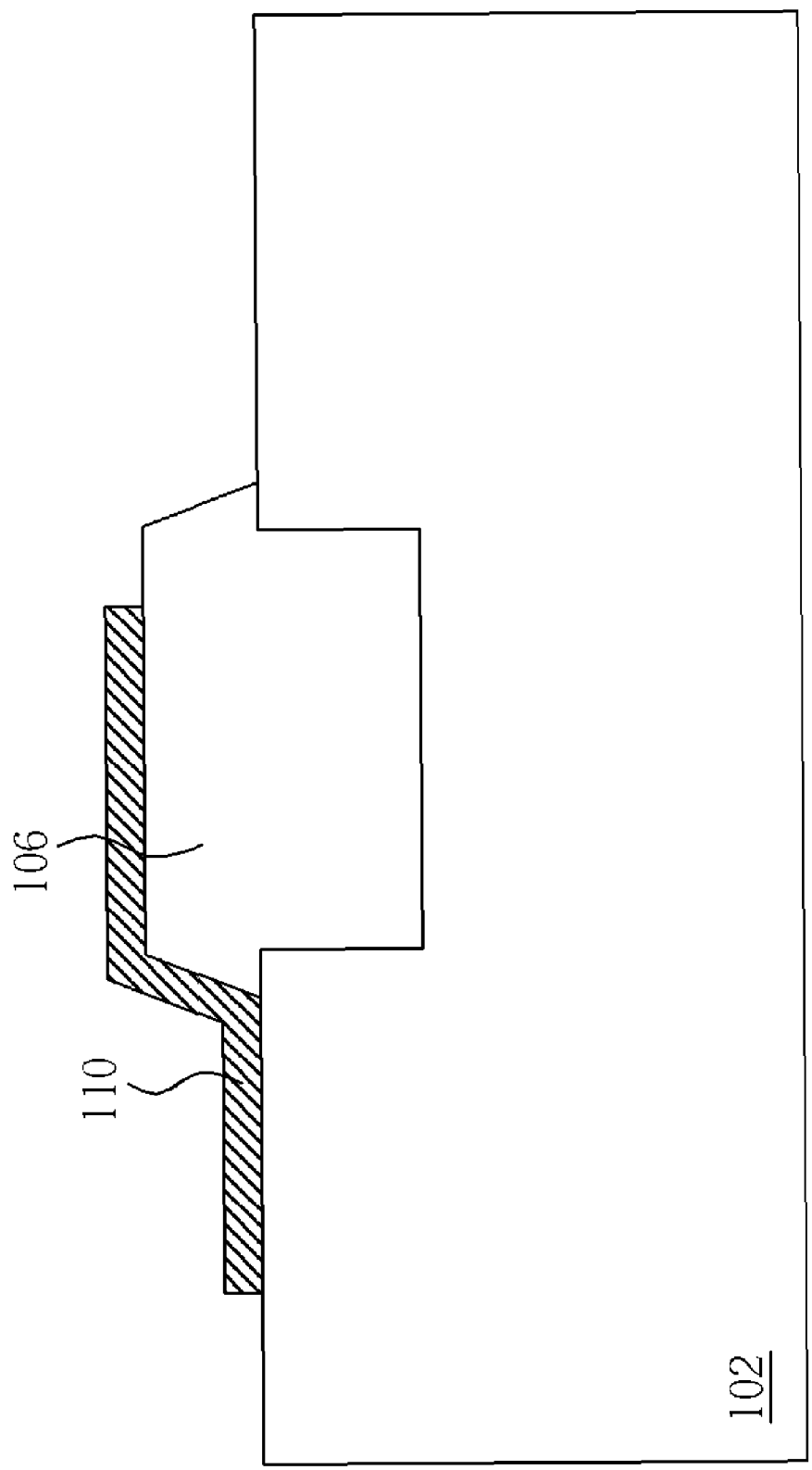
Figure 9:
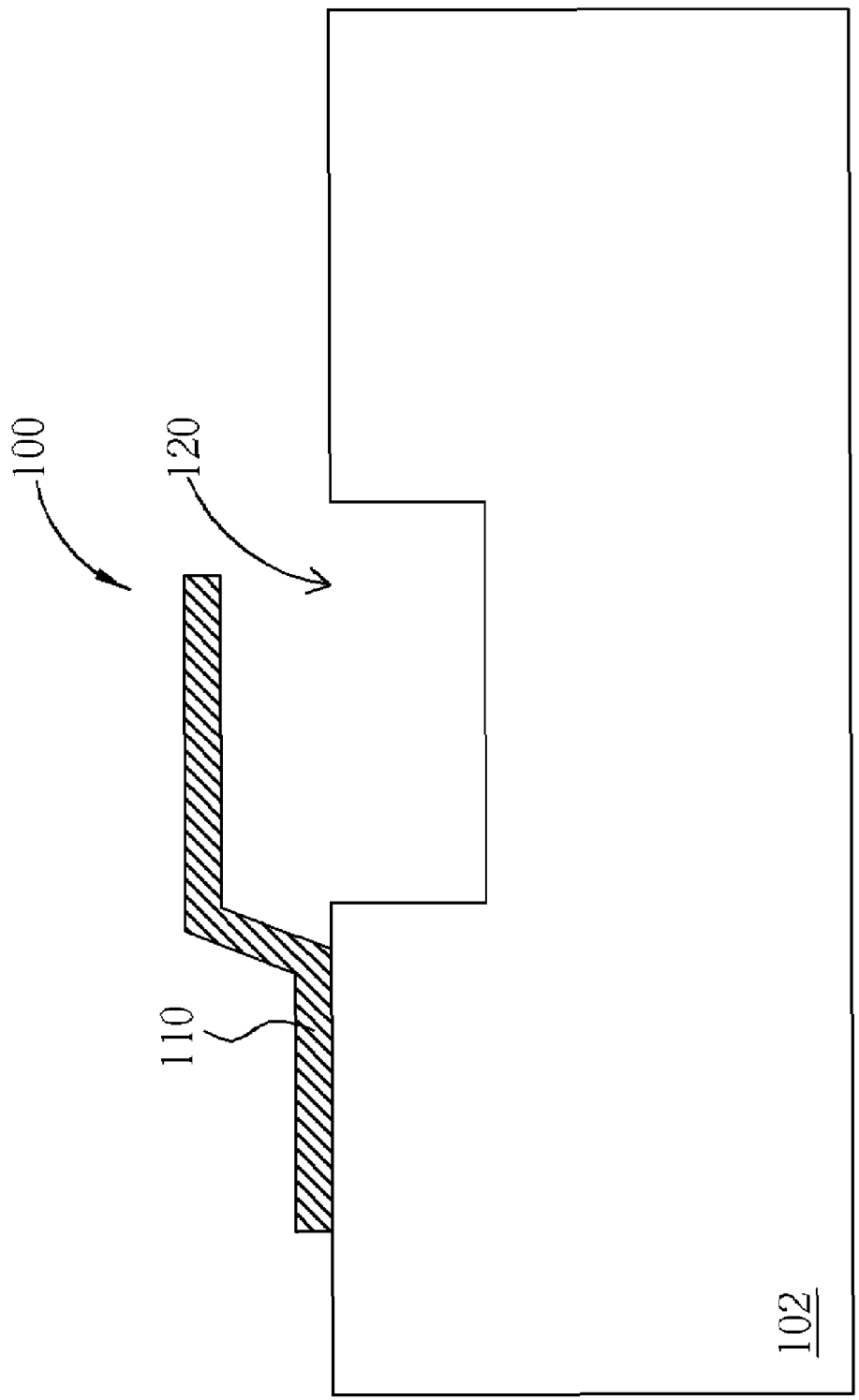

Next, as shown in FIG. 8, a lift off process is performed, and the second patterned photoresist layer 108 and the structure layer 110 above the second patterned photoresist layer 108 are removed by a wet etching process. At last, as shown in FIG. 9, a dry etching process is performed to remove the sacrificial layer 106 in order to make the structure layer 110 above the substrate 102 and the sacrificial layer 106 become the suspension structure 100 and the chamber 120, wherein the dry etching process can include a sputtering etching process, a plasma etching process, or a RIE process.

Figure 10:
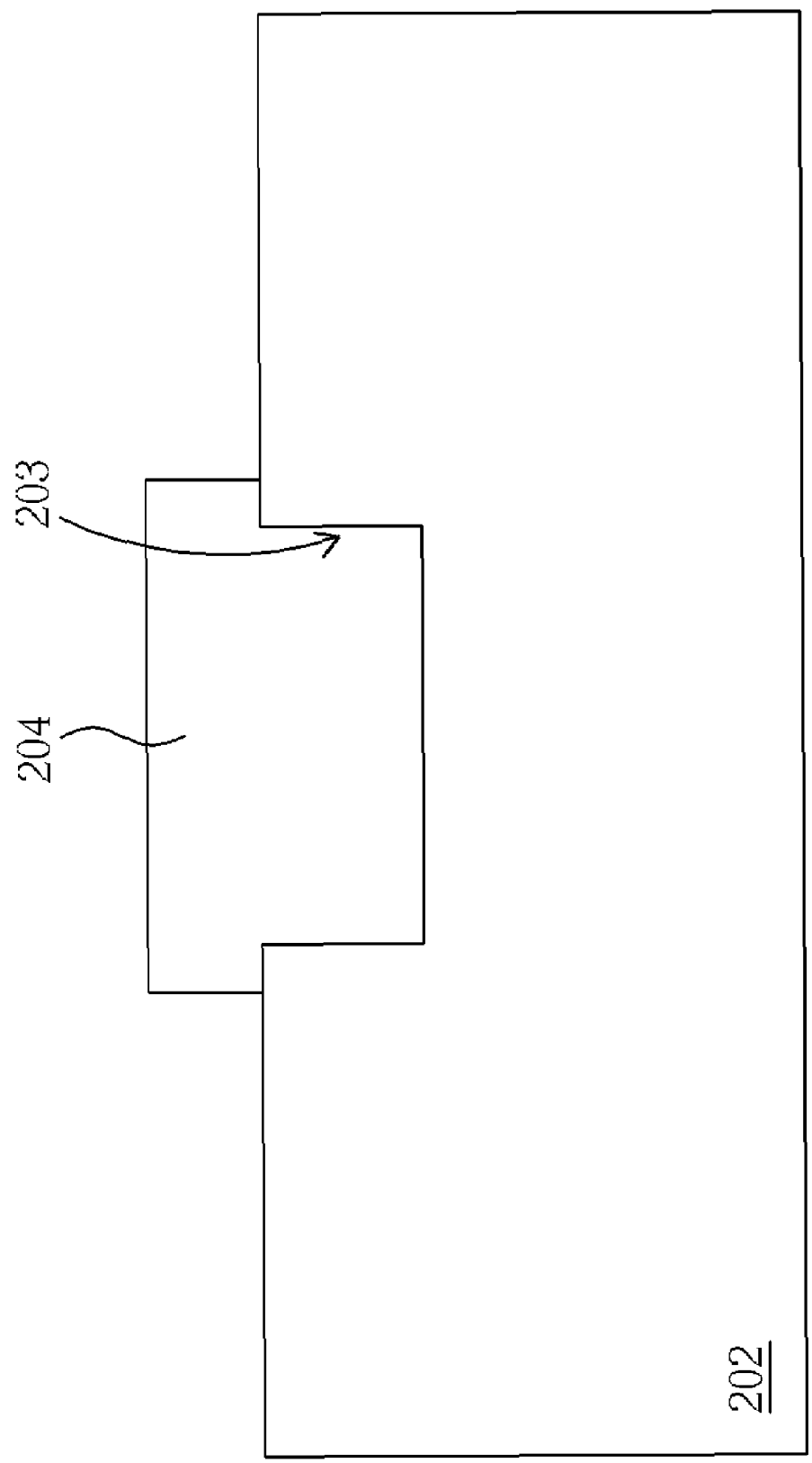
FIG. 10 to FIG. 14 shows the method of manufacturing a suspension structure and chamber in accordance with the second preferred embodiment of the present invention.

Please refer to FIG. 10 to FIG. 14. FIG. 10 to FIG. 14 shows the method of manufacturing a suspension structure and chamber in accordance with the second preferred embodiment of the present invention. As shown in FIG. 10, a hole 203 is formed on the substrate 202 first, and a first patterned photoresist layer 204 is formed on the substrate 202, wherein the substrate 202 can be a silicon wafer or a SOI, but is not limited to this. The method of forming the hole 203 can include a wet etching process, a sputtering etching process, a plasma etching process, or a RIE process, and the shape of the hole 203 can be a semicircle, semi-ellipse, trapezoid, rectangle, trapezoid with round corners, or rectangle with round corners by adjusting the process parameters to meet the requirement of different MEMS devices.

Figure 11:
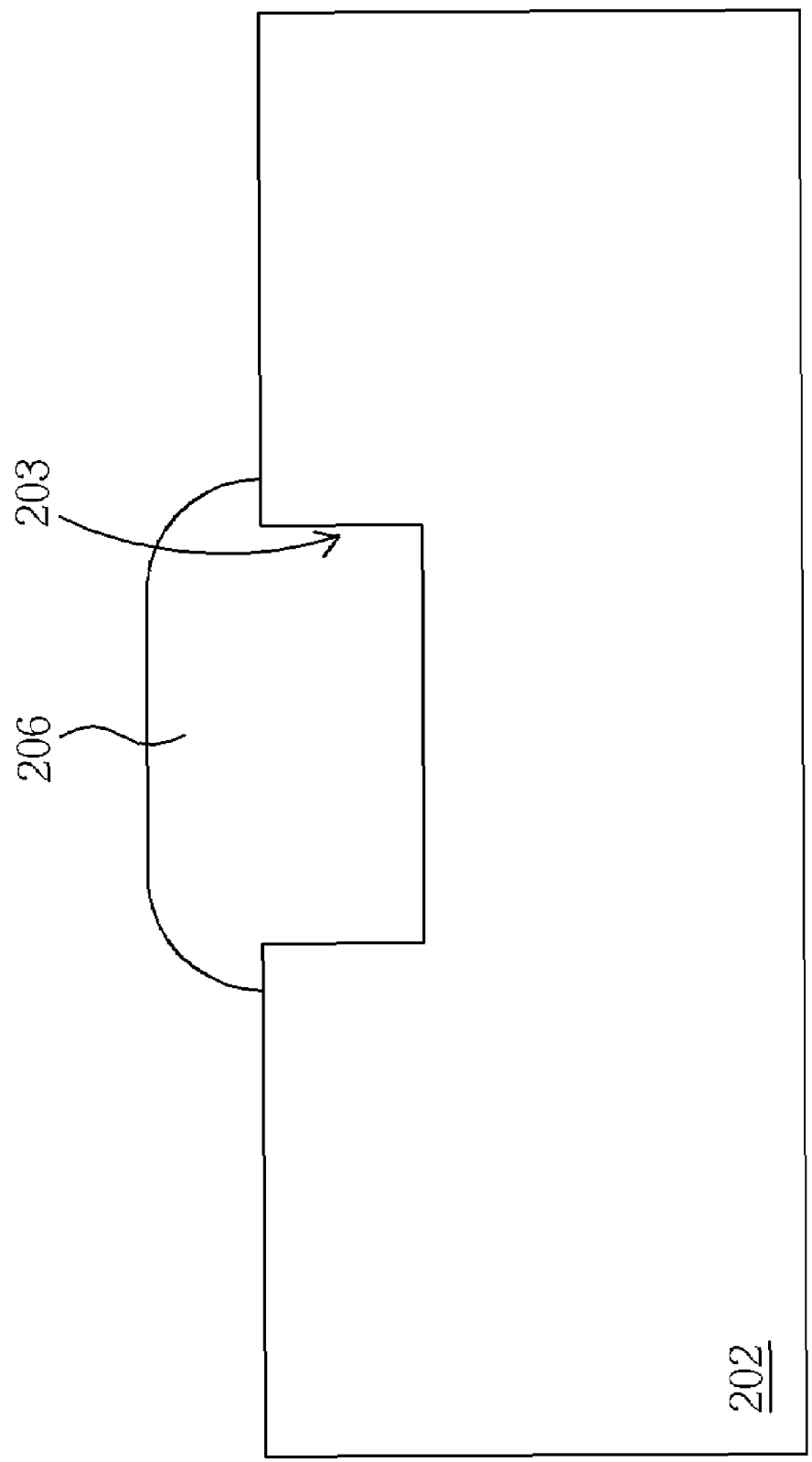

Next, as shown in FIG. 11, since the photoresist will be fluid and hardened after being heated, the first patterned photoresist layer 204 is heated to be hardened as a sacrificial layer 206. The process of heating the first patterned photoresist layer 204 can be performed using an oven or heating plate, etc. In the second preferred embodiment of the present invention, the sacrificial layer 206 has tilted sidewalls with round corners by adjusting the heating process parameters such as the heating temperature and time, as shown in FIG. 11.

Figure 12:
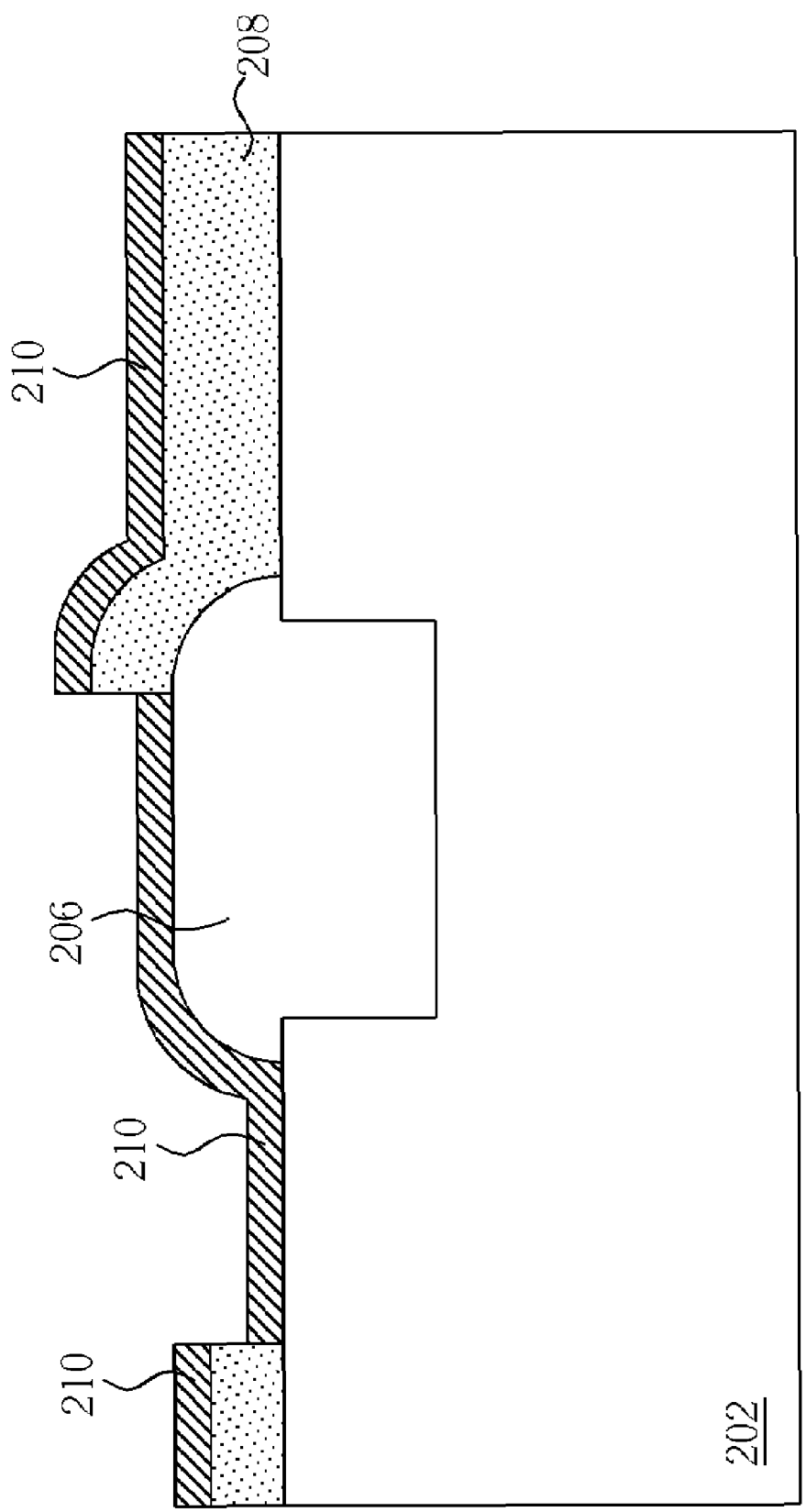

Next, as shown in FIG. 12, a second patterned photoresist layer 208 is formed on the substrate 202 and the sacrificial layer 206, and the second patterned photoresist layer 208 exposes a part of the substrate 202 and the sacrificial layer 206, and then a structure layer 210 is formed on the substrate 202, the second patterned photoresist layer 208, and the sacrificial layer 206, wherein the structure layer 210 can include metals, monocrystalline silicon, polycrystalline silicon, or amorphous silicon, and the method of forming the structure layer 210 can include a CVD process or a plating process.

Figure 13:
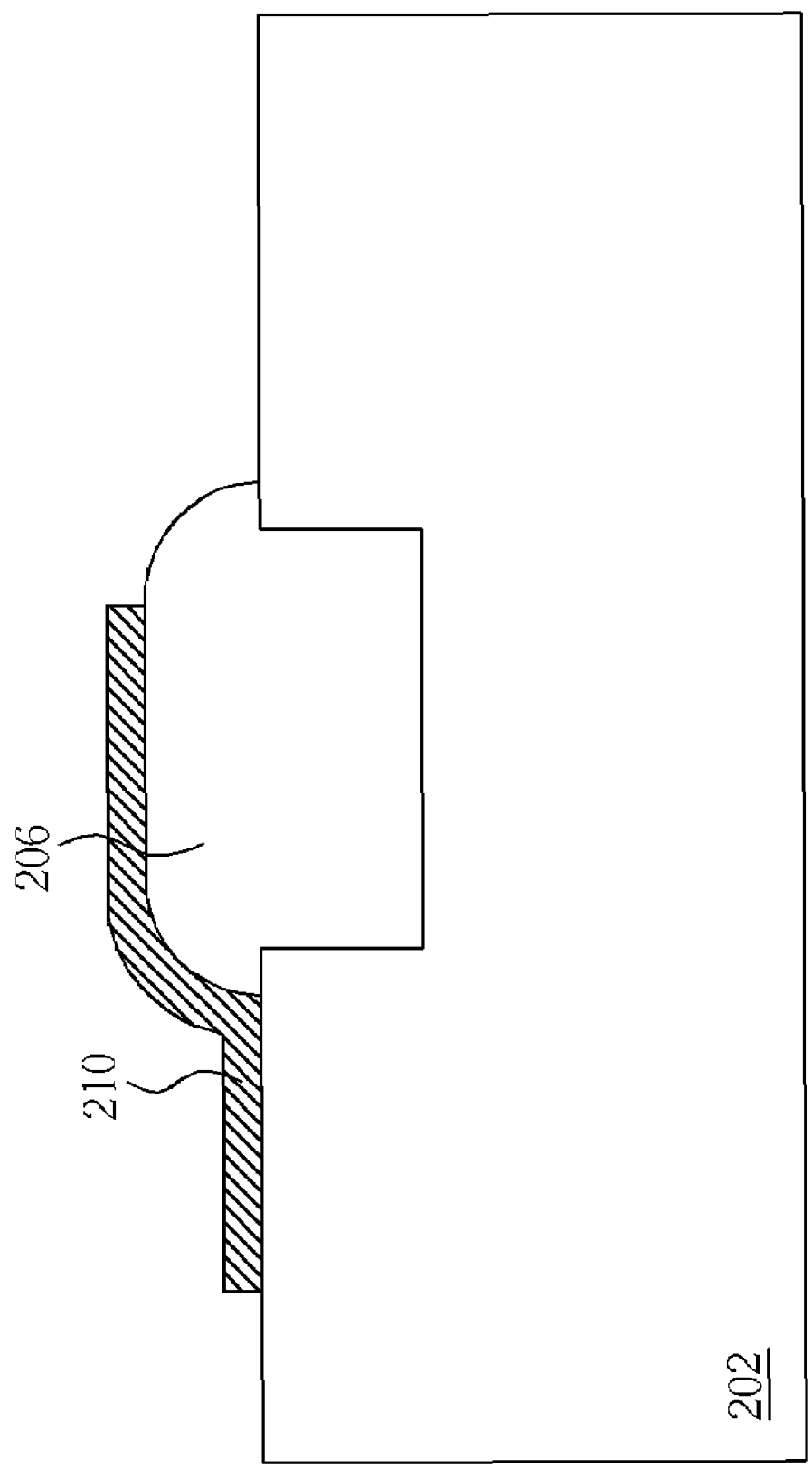
Figure 14:
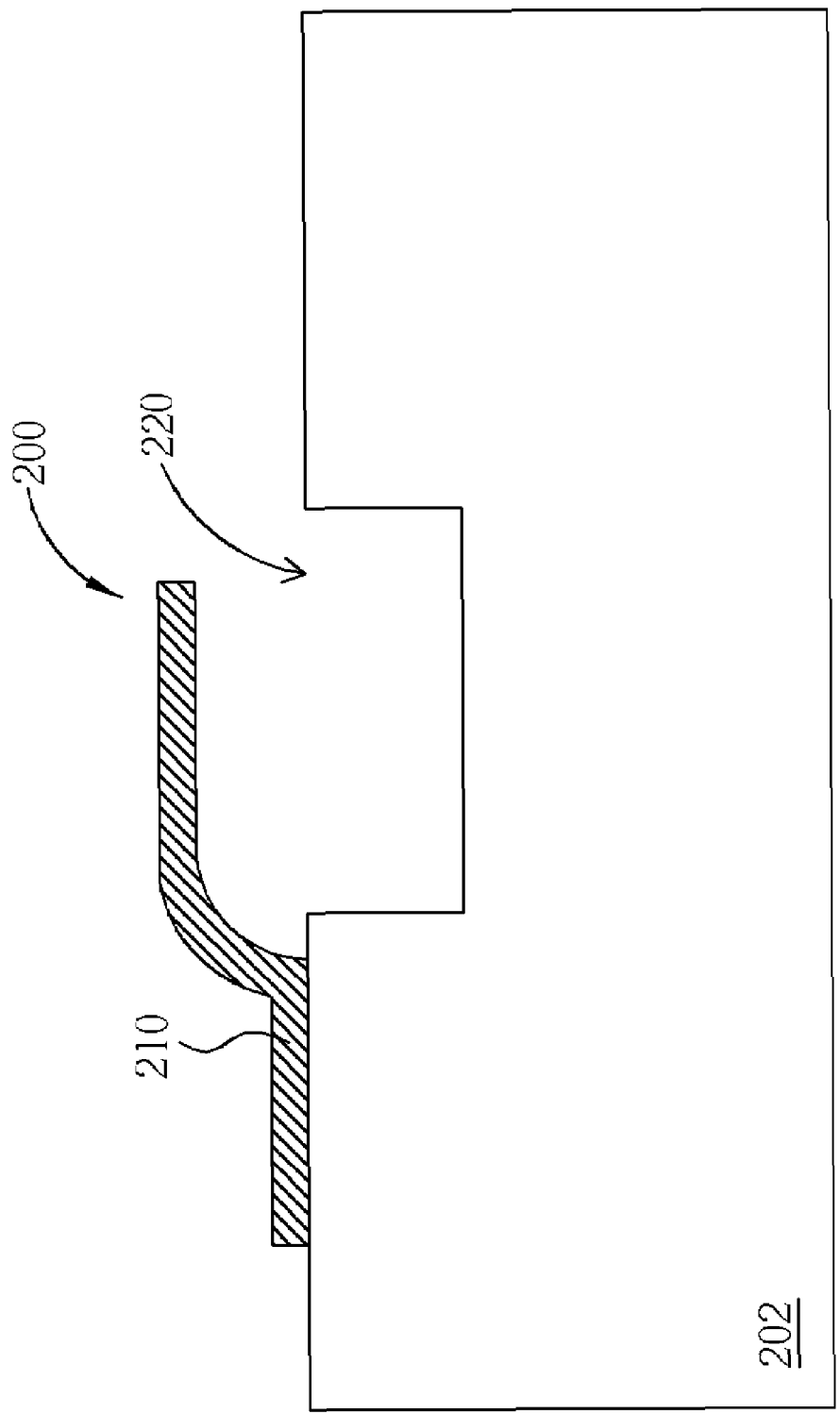

Next, as shown in FIG. 13, a lift off process is performed, and the second patterned photoresist layer 208 and the structure layer 210 above the second patterned photoresist layer 208 are removed by a wet etching process. At last, as shown in FIG. 14, a dry etching process is performed to remove the sacrificial layer 206 in order to make the structure layer 210 above the substrate 202 and the sacrificial layer 206 become the suspension structure 200 and the chamber 220, wherein the dry etching process can include a sputtering etching process, a plasma etching process, or a RIE process.

Since the method of the present invention utilizes the photoresist as the sacrificial layer to form the suspension structure, therefore monocrystalline silicon, polycrystalline silicon, amorphous silicon, or metals such as Al or Cu, etc. can be used for the structure layer, and the structure layer is not limited to using a specific metal that is not able to be etched by the KOH etching liquid. In addition, the method of the present invention utilizes the dry etching process to remove the sacrificial layer, and therefore the suspension structure will not be affected by the surface tension of the etching liquid, which results in the broken structure layer or the suspension part sticking to the substrate surface. Furthermore, please note that the present invention utilizes the photoresist after being heated and hardened as the sacrificial layer so that the suspension structure will not be broken easily due to bad covering at the corners, and the present invention can design and manufacture the suspension structure and the chamber with various shapes by controlling shape of the photoresist after being heated and hardened to substantially increase the application fields of the suspension structure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a suspension structure comprising:
    providing a substrate;
    forming a hole on the substrate;
    forming a first patterned photoresist layer on the substrate and the first patterned photoresist layer filling the hole;
    heating the first patterned photoresist layer to harden it as a sacrificial layer;
    forming a second patterned photoresist layer on the substrate and the sacrificial layer, the second patterned photoresist layer exposing a part of the substrate and the sacrificial layer;
    forming a structure layer on the substrate, the second patterned photoresist layer, and the sacrificial layer;
    performing a lift off process to remove the second patterned photoresist layer and the structure layer above the second patterned photoresist layer; and
    performing a dry etching process to remove the sacrificial layer in order to make the structure layer on the substrate and the sacrificial layer become the suspension structure and the hole on the substrate become a chamber.

2. The method of claim 1, wherein the sacrificial layer has sidewalls with round corners.

3. The method of claim 1, wherein the sacrificial layer has tilted sidewalls.

4. The method of claim 1, wherein the structure layer comprises metal.

5. The method of claim 1, wherein the structure layer comprises monocrystalline silicon, polycrystalline silicon, or amorphous silicon.

6. The method of claim 1, wherein the method of forming the structure layer comprises a chemical vapor deposition process of a plating process.

7. The method of claim 1, wherein the chemical vapor deposition (CVD) process comprises an atmospheric pressure chemical vapor deposition process.

8. The method of claim 1, wherein the lift off process comprises a wet etching process.

9. The method of claim 1, wherein the dry etching process comprises a sputtering etching process, a plasma etching process, or a reactive ion etching (RIE) process.

* * * * *